United States Patent
Lin et al.

(10) Patent No.: US 6,207,532 B1
(45) Date of Patent: Mar. 27, 2001

(54) STI PROCESS FOR IMPROVING ISOLATION FOR DEEP SUB-MICRON APPLICATION

(75) Inventors: Chrong Jung Lin, Hsin-Tien; Shui-Hung Chen; Jiaw-Ren Shih, both of Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/408,494

(22) Filed: Sep. 30, 1999

(51) Int. Cl.$^7$ .................................................. H01L 21/76
(52) U.S. Cl. .......................... 438/424; 438/427; 438/445; 438/430
(58) Field of Search .................................... 438/446, 445, 438/424, 427, 221, 218, 223, 430

(56) References Cited

U.S. PATENT DOCUMENTS

| | | | |
|---|---|---|---|
| 4,472,240 * | 9/1984 | Kameyama | 156/648 |
| 4,495,025 * | 1/1985 | Haskell | 156/648 |
| 5,372,968 | 12/1994 | Lur et al. | 437/67 |
| 5,612,248 | 3/1997 | Jeng | 437/69 |
| 5,721,174 | 2/1998 | Peidous | 438/445 |
| 5,753,561 | 5/1998 | Lee et al. | 438/424 |
| 5,854,121 | 12/1998 | Gardner et al. | 438/425 |
| 5,891,770 * | 4/1999 | Lee | 438/221 |
| 5,895,253 * | 4/1999 | Akram | 438/424 |
| 5,904,540 * | 5/1999 | Sheng et al. | 438/427 |
| 6,020,230 * | 2/2000 | Wu | 438/222 |
| 6,043,135 * | 3/2000 | Noda | 438/404 |

* cited by examiner

*Primary Examiner*—Long Pham
(74) *Attorney, Agent, or Firm*—George O. Saile; Stephen B. Ackerman

(57) ABSTRACT

A new method is provided for the creation of a Shallow Trench Isolation region. A layer of pad oxide is deposited on the surface of a substrate; a layer of nitride is deposited over the layer of pad oxide. The layers of pad oxide and nitride are patterned and etched over the region where the STI is to be formed, a trench is etched in the silicon for the STI region. A layer of TEOS, that serves as a buffer spacer oxide, is deposited over the surface of the layer of nitride thereby including the inside of the created trench. The layer of TEOS is etched removing the TEOS from the surface of the nitride and from the bottom of the trench but leaving a layer of TEOS in place along the sidewalls of the trench. The bottom of the trench is next etched after which the TEOS spacer buffer is removed from the sidewalls of the trench. The sidewalls of the trench now have a non-linear profile. A layer of TEOS is deposited and polished leaving the trench filled with TEOS and at the same time removing the nitride from the surface of the pad oxide. N-well and P-well implants are performed after which N+ and P+ implants are performed around the periphery of the STI trench.

21 Claims, 4 Drawing Sheets

STI PROCESS FOR IMPROVING ISOLATION FOR DEEP SUB-MICRON APPLICATION

BACKGROUND OF THE INVENTION (1) Field of the Invention

The invention relates to the fabrication of integrated circuit devices, and more particularly, to a method of forming Shallow Trench Isolation regions for the era of sub-micron semiconductor device feature size.

(2) Description of the Prior Art

In fabricating semiconductor Integrated Circuits (IC's), the areas in the surface of the substrate that are dedicated to the formation of separate device features must be electrically isolated from each other. A combination of device features form the finished device that has been designed and fabricated to perform a particular function and as such is referred to as an active device. The requirement of electrical isolation has given rise to a range of methods that are aimed at creating electrical isolation between device features and between devices within a semiconductor die.

The continuing trend in the semiconductor industry is to form semiconductor devices on silicon substrates that have increasingly higher device densities and smaller device feature sizes. This continued device shrinkage and increased device density brings with it new problems. One such problem in particular relates to the necessity of providing an efficient and reliable process to separate active devices that function on the current miniaturized scale. For the Very Large Scale Integration (VLSI) and Ultra Large-Scale Integration (ULSI) technologies, minimum device feature size of 0.25 um. is being approached. In the fabrication of such integrated circuits one of the most frequently used methods by which one region of the semiconductor substrate is electrically isolated from another region is the Shallow Trench Isolation (STI).

One other method that has previously been used to create isolation regions is the so-called "Local Oxidation of Silicon" (LOCOS) process. The LOCOS process is frequently used to form CMOS gate structures. For this LOCOS process, a temporary patterned nitride layer is used as a protection or resistant area to cover the future active areas during the subsequent field oxidation process. The LOCOS process can further briefly be described as follows: a pad oxide is formed on the surface of a silicon substrate, a layer of silicon nitride ($Si_3N_4$) is deposited over the layer of pad oxide. The pad oxide is a thin thermal oxide that allows better adhesion between the nitride and silicon and acts as a stress relaxation layer during field oxidation. The nitride and oxide layers are patterned and etched thereby creating openings exposing those portions of the silicon substrate where the local oxidation is to be formed. A boron channel-stop layer is ion implanted into the isolation regions (of the CMOS device). The field oxide is grown within the openings and the nitride and the pad oxide layers are removed. This completes the local oxidation. A disadvantage of the LOCOS process is that the process requires long oxidation times (thermal budget) and that lateral oxidation under the barrier mask ("bird's beak encroachment") limits the minimum spacing between adjacent active device areas to about the 1 um range. This prevents further increases in device packaging density using the LOCOS process.

One method of circumventing the LOCOS limitations and to further reduce the field oxide (FOX) minimum feature size is to use shallow trench isolation (STI).

In using the STI approach for the VLSI technology, deep trenches are typically made in the substrate by reactive ion etching. The trenches are typically about 5–6 um. deep, about 2–3 um. wide and spaced about 2.5.–3.5 um. apart from another trench. The ULSI technology requires trenches that are deeper and spaced closer together posing new problems of field turn-on, punchthrough, gap-fill within the trenches and others. STI's can be made using, for instance, Buried Oxide (BOX) isolation for the shallow trenches. The method involves filling the trenches with a chemical vapor deposition (CVD) silicon oxide ($SiO_2$) and then etching back or mechanically/chemically polishing the $SiO_2$ to yield a planar surface. The shallow trenches etched for the BOX process are anisotropically plasma etched into the silicon substrate and are, for ULSI applications, typically between 0.5 and 0.8 micrometer (um.) deep. STI are formed around the active device to a depth between 4000 and 20000 Angstrom.

Following the forming of the trenches they are filled with a suitable dielectric material such as oxide, polysilicon or an organic polymeric material, for example polyimide. While the dielectric-filled trench isolation can provide effective dielectric isolation between devices, the fundamental disadvantage of this scheme is that the resulting structure tends to be non-planar. This lack of planarity is mainly due to the difference in the amount of fill that is required to fill a multiplicity of closely spaced trenches and the dielectric that is deposited on the surface of the substrate. This effect is further aggravated by the steps of bake and cure that are applied to the deposited dielectric in order to cure the dielectric and to evaporate the solvents from the dielectric. Further problems can be caused in this respect by the fact that in many chip designs there can be a significant difference in device density across the chip. In the design of memory chips for instance, the memory functions of the chip can consist of 10.000 or more memory elements. These memory elements are surrounded by their supporting logic functions which tend to have considerably lower density of active elements thereby further aggravating the problems of even distribution of the deposited dielectric across the surface of the chip and of obtaining good planarization for the entire surface of the chip. It is clear that poor planarity across the surface of the trenches leads to further problems in creating interconnect patterns and in depositing overlying layers of insulation and metalization. These overlying layers of metalization must be patterned and etched, a typically photolithographic process that requires constant and low depth of focus. Where this depth of focus is not as required, wire patterns of poor quality are created resulting a serious yield detractors and concerns of device reliability.

Another problem associated with the formation of STI regions is that if the silicon oxide is etched or polished to the surface of the silicon substrate, dishing occurs in the surface of the silicon oxide resulting in a concave surface of the STI regions. This results in recesses in the field oxide at the edge of the device areas. Later, when the gate electrodes are made for the FET's, the gate electrodes extend over the device area edge, causing an undesirable lower and variable threshold voltage when the devices are completed. It is therefore desirable to make isolation areas that extend higher than the substrate surface to avoid this problem while reducing manufacturing costs.

It must further be observed that recent requirements for the creation of holes within deep layers of either conducting or other materials have resulted in creating openings that have aspect ratios in excess of 3. It is beyond the capability of the existing techniques to fill gaps of this aspect ratio with High Density Plasma-oxide (HDP-oxide). This lack of adequate filling of gaps also occurs for holes that have a reentrant spacer profile. A reentrant spacer profile is a profile where the walls of the openings are not vertical but are sloped; this sloping of the walls makes complete penetration of the HPD-oxide into the hole difficult and, under certain conditions, incomplete.

As a consequence of incomplete deposition of HDP-oxide into high aspect ratio holes, keyholes or deposition irregularities will be formed. These keyholes or deposition irregularities are characterized by non-homogeneous deposition that form in the deposited HDP-oxide.

The indicated condition for the formation of a keyhole can also occur where a high aspect ratio through-hole is formed by RIE and where the formation position of the through-hole may deviate from the correct position due to mask misalignment or a process variation. The created through-hole can in this case exhibit a profile that inhibits complete and uniform deposition of HDP-oxide.

As an example of the formation of N-well and P-well structures, the formation of these structures for typical CMOS devices is highlighted below.

One of the advantages of the application of Complementary Metal Oxide Silicon (CMOS) devices is the reduced power consumption that can be achieved with these devices. This reduced power consumption is achieved by the fact that the CMOS devices use both N-channel and P-channel FET's whereby only one of the two transistors is on at any given time and virtually no current flows because of the high impedance of the device. The conventional CMOS devices are formed in and on single crystalline silicon semiconductor substrates by fabricating the N-channel FET's in P-wells in the silicon substrate while fabricating P-channel FET's in N-wells in the silicon substrate. The P-well is formed in the active device regions by ion implanting a P-type dopant such as boron ($B^{11}$) in the P-well regions and an N-well dopant such as arsenic ($Ar^{75}$) in the N-well regions. Conventional photolithographic techniques are used to form implant block-out masks to prevent implanting the P-type dopant in the N-well and the N-type dopant in the P-well. The substrate is then annealed to achieve the desired dopant profile, to activate the dopant and to remove dopant implant damage. Typically, the wells are between about 2.0 and 3.0 um deep and are doped to a concentration between about 1.0E15 and 1.0E17 atoms/$cm^3$.

To form the source and drain regions for the CMOS devices, the p-well region is subjected to an n-type implant, for instance arsenic at a dose of between about 2.0E15 and 1.0E16 ions/$cm^2$ and an energy of between about 20 and 70 KeV. The n-well region is subjected to a p-type implant, for instance boron at a dose of between about 1.0E15 and 1.0E16 ions/$cm^2$ and an energy of between about 50 and 90 KeV.

In the formation of Shallow Trench Isolation regions for deep sub-micron processes, the silicon that surrounds the created trench for the STI region needs an ion field implantation. This implantation is required to prevent $N^+$ to N-well and $P^+$ to P-well punch-through. This field implant increases the junction capacitance of the STI region resulting in degraded device performance. The implant needs to penetrate the sides and the bottom of the STI trench, a deeper trench combined with the sub-micron dimensions of the trench surface results in very step sidewalls for the trench which limits the effectiveness of the required ion implant and, as a consequence, the effectiveness of preventing punchthrough of the STI region. The trench junction capacitance could be reduced by performing a deeper implant (higher implant energy); this approach is limited due to the trench angle for deep trench applications.

The invention addresses the problem of creating a STI region using a deep trench for sub-micron device feature size applications. The invention teaches a self-aligned process that does not require additional masking for creating a deep trench. The process of the invention results in a top trench with a relatively large angle of the sidewalls in addition to a bottom trench that provides the required isolation.

U.S. Pat. No. 5,721,174 (Peidous) discloses a (1) etch 1st Trench (2) form SiN spacer 60 in trench (3) etch 2nd trench 70, FIG. 4A (4) different (keep spacer) and (5) fill 1st and 2nd trench with oxide. This is close to the invention. Peidous does not remove the spacer in contrast with the invention's (4) that removes the spacer.

U.S. Pat. No. 5,854,121 (Gardner et al.) shows a STI process using spacers 20 and a one step trench etch.

U.S. Pat. No. 5,753,561 (Lee et al.) shows a method of etching STI trenches with rounded corners using a spacer.

U.S. Pat. No. 5,612,248 (Jeng) recites a STI process using a poly and an oxide spacer.

U.S. Pat. No. 5,372,968 (Lur et al.) teaches a STI method with a two step etch that uses SiN spacers. This differs from the invention.

SUMMARY OF THE INVENTION

A principle objective of the invention is to provide a method of creating Shallow Trench Isolation regions for the era of deep sub-micron device feature size.

Another objective of the invention is to provide a method of creating Shallow Trench Isolation regions that have improved isolation characteristics without increasing the STI junction capacitance.

Yet another objective of the invention is to provide a method of creating Shallow Trench Isolation regions with a deeper trench but without increasing the trench angle.

A still further objective of the invention is to provide a method of creating Shallow Trench Isolation regions that do not have the narrow trench width effect and where therefore trench punchthrough performance can be improved by ion implant.

In accordance with the objectives of the invention a new method is provided for the creation of a Shallow Trench Isolation region. A layer of pad oxide is deposited on the surface of a substrate; a layer of nitride is deposited over the layer of pad oxide. The layers of pad oxide and nitride are patterned and etched over the region where the STI is to be formed, a trench is etched in the silicon for the STI region. A layer of TEOS, that serves as a buffer spacer oxide, is deposited over the surface of the layer of nitride thereby including the inside of the created trench. The layer of TEOS is etched removing the TEOS from the surface of the nitride and from the bottom of the trench but leaving a layer of TEOS in place along the sidewalls of the trench. The bottom of the trench is next etched after which the TEOS spacer buffer is removed from the sidewalls of the trench. The sidewalls of the trench now have a non-linear profile. A layer of TEOS is deposited and polished leaving the trench filled with TEOS and at the same time removing the nitride from the surface of the pad oxide. N-well and P-well implants are performed after which N+ and P+ implants are performed around the periphery of the STI trench.

DESCRIPTION OF THE PREFERRED EMBODIMENTS

Figure 1:
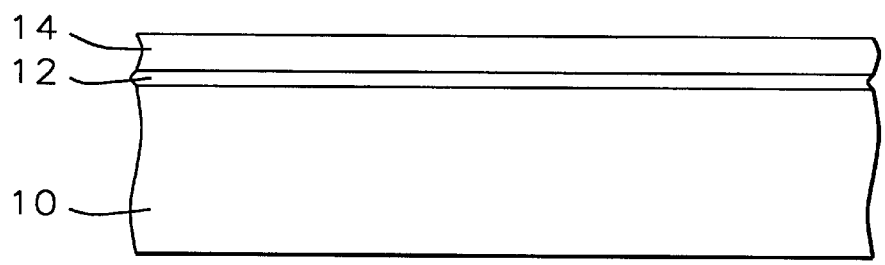
FIG. 1 shows a cross section of a substrate over which a layer of pad oxide and a layer of nitride have been deposited.

Referring now specifically to FIG. 1, there is shown a cross section of a silicon substrate 10. A layer 12 of pad oxide has been deposited over the surface of the silicon substrate 10. A layer 14 of nitride has been deposited over the surface of the layer 12 of pad oxide.

For the deposition of the thin layer 12 of pad oxide, Low Pressure CVD is the preferred deposition technology because of the high deposition rates and the excellent film thickness uniformity.

The thin layer 12 of oxide is typically deposited to a thickness of between 20 and 500 Angstrom. The method of deposition is furnace oxide deposition or CVD oxide deposition. Layer 12 serves as a stress release between the silicon substrate 10 and layer 14 of silicon nitride.

Layer 14 is an etch stop layer containing silicon nitride and is typically deposited using LPCVD or PECVD procedures, at a temperature between about 200 and 800 degrees C., to a thickness between about 200 and 5000 Angstrom employing SiN or $SiO_xN_y$ as a silicon source material and ammonia as a nitrogen source material.

Figure 2:
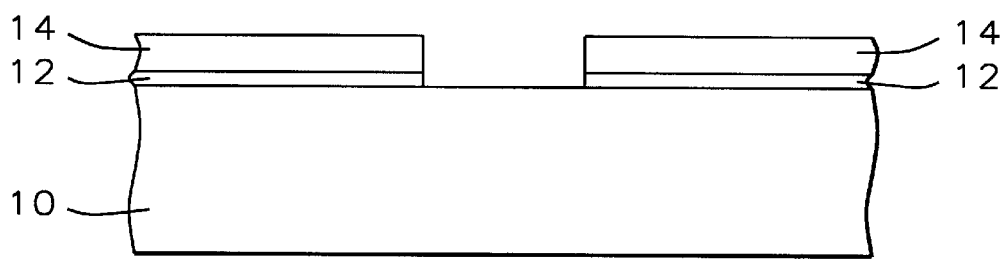
FIG. 2 shows a cross section of a substrate after the layers of pad oxide and nitride have been patterned and etched.

FIG. 2 shows a cross section of substrate 10 after the layer 12 of pad oxide and the layer 14 of nitride have been patterned and etched. The opening that has been etched through layer 12 and 14 aligns with the surface of the substrate where the trench for the STI will be etched.

The layer 14 of silicon nitride can be anisotropically etched with a plasma gas containing carbon tetrafloride ($CF_4$) containing fluorine ions, in a commercial etcher such as a parallel plate RIE apparatus or an electron cyclotron resonance (ECR) plasma reactor. Layer 14 of silicon nitride can also be etched using $He/NF_3$ as an etchant at a temperature of between about 80 and 100 degrees C. and a pressure of about 1.20 and 1.30 Torr for a time of between about 20 and 30 seconds using a dry etch process.

Figure 3:
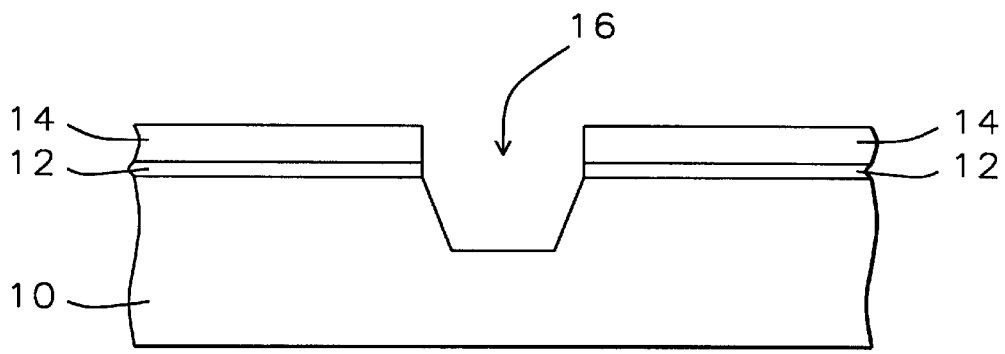
FIG. 3 shows a cross section of a substrate after a trench has been etched in the silicon substrate.

FIG. 3 shows a cross section of the substrate after a trench 16 has been etched in the surface of substrate 10. The process of creating the STI opening 16 is performed mainly by plasma etching. Basically, in plasma etching as used in the manufacturing of silicon integrated devices, a silicon wafer on whose surface has been deposited various layers, is positioned on a first electrode in a chamber that also includes a second electrode spaced opposite the first. As a gaseous medium that consists of one or more gasses is flowed through the chamber, an r-f voltage, which may include components at different frequencies, is applied between the two electrodes to create a discharge that ionizes the gaseous medium and that forms a plasma that etches the wafer. By appropriate choice of the gasses of the gaseous medium and the parameters of the discharge, selective and anisotropic etching is achieved. In most modern processes, a dry etch is performed wherein the wafer is exposed to a plasma, formed in the flow of one or more gasses. Typically, one or more halogenated compounds are used as an etchant gas. For example, CF4, CHF3 (Freon 23) $SF_6$ or $NF_3$ can be used. Added can be gases such as $O_2$, Ar and $N_2$.

Figure 4:
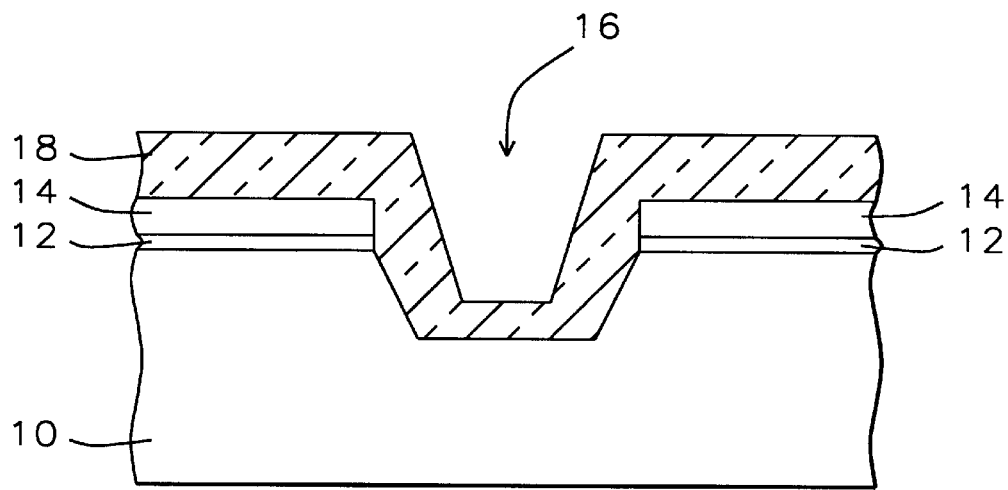
FIG. 4 shows a cross section of a substrate after a layer of TEOS has been deposited that will serve as Buffer Spacer Oxide.

FIG. 4 shows a cross section of the silicon substrate after a layer 18 of tetra-ethyl-ortho-silicate (TEOS) has been deposited over the surface of the etched layer 14 of nitride and over the inside surfaces of the opening 16. TEOS is a non-porous dielectric material that is typically applied as a passivating layer. The layer of TEOS can be deposited using PECVD at a temperature between about 300 and 700 degrees C. to a thickness between about 1000 and 3000 Angstrom.

Figure 5:
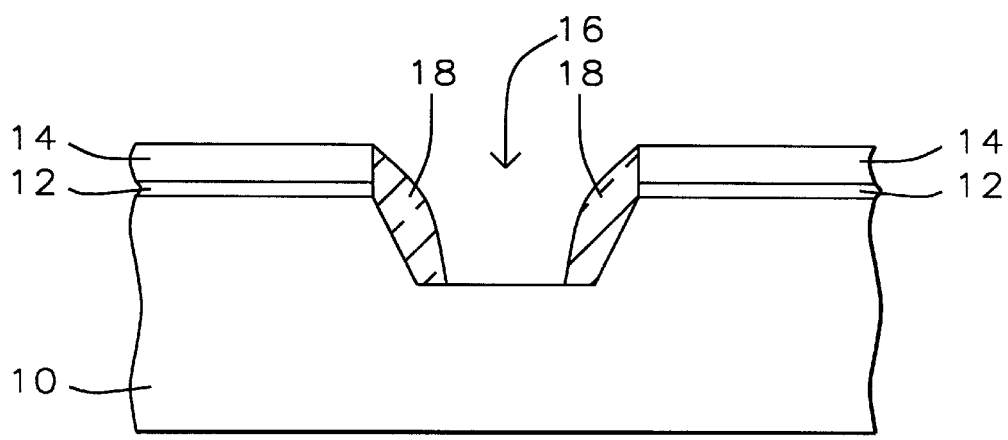
FIG. 5 shows a cross section of a substrate after etching of the layer of Buffer Spacer Oxide of TEOS.

FIG. 5 shows a cross section of the substrate after the layer of TEOS that serves as Buffer Spacer Oxide has been etched. The etchback of layer 18 can be performed using reactive ion, plasma, sputter etch technologies or anisotropic RIE. A typical etchant is hot phosphoric acid; also $CHF_3$ or $CF_4$—$O_2$—He used during RIE.

It must be noted in FIG. 5 that the remaining layer 18 of TEOS forms a layer of Buffer Spacer Oxide along the sidewalls of the trench 16. This layer 18 of Buffer Spacer Oxide protects the sidewalls of the trench during the following etch of the bottom of the trench, see FIG. 6.

Figure 6:
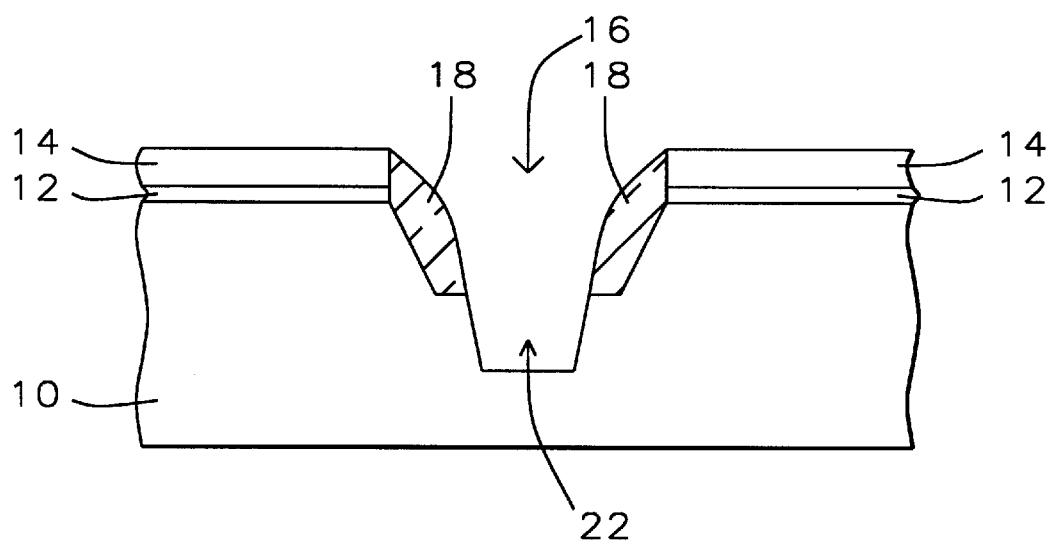
FIG. 6 shows a cross section of a substrate after the bottom of the trench for the STI has been further etched.

FIG. 6 shows a cross section of the substrate after the bottom of the trench has been etched thereby creating a substantially deeper trench. This additional etch, which lowers the bottom of the trench for the STI region, can be performed using the same conditions and considerations as previously have been indicated for the original etch of the silicon surface as indicated above under FIG. 3. The trench is extended by the profile 20 that has been indicated in FIG. 6. It must be pointed out that, according to the profile of the trench that is shown in FIG. 6, the trench that is used under the invention is considerably deeper than the typical trench that is used for STI regions. This deeper trench can be achieved due to the Buffer Spacer Oxide 18 that is left in place during the second etch of the silicon, this second etch creates the opening 20 as an addition to the original opening 16.

Figure 7:
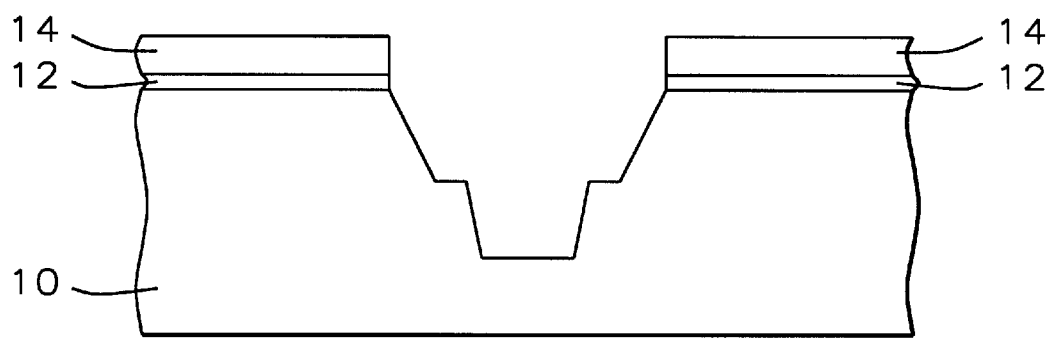
FIG. 7 shows a cross section of a substrate after the Buffer Spacer Oxide has been removed from the sidewalls of the trench.

FIG. 7 shows a cross section of the silicon substrate after the layer 18 of TEOS that has served as Buffer Spacer Oxide has been removed from the sidewalls of the trench 16/20 (FIG. 6) that has been formed for the STI region. The etch processing conditions that are applied for this etch are the same as the conditions that have been indicated above for the etching of the layer of TEOS under FIG. 5 and need not be restated at this time.

Figure 8:
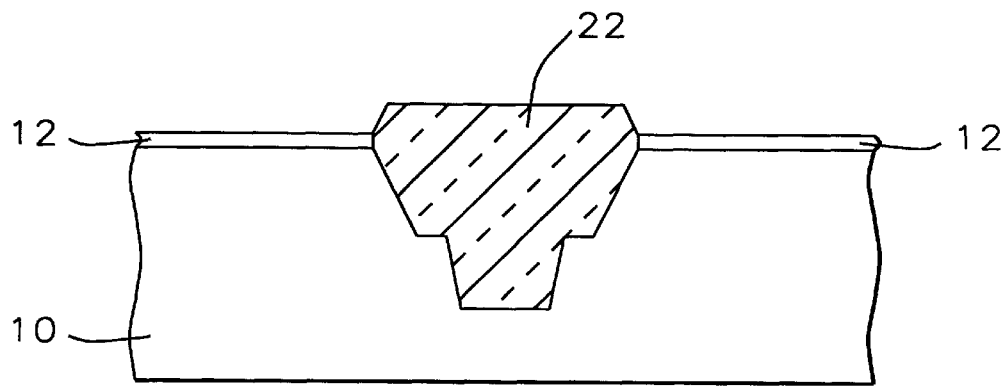
FIG. 8 shows a cross section of a substrate after a layer of TEOS oxide has been deposited and polished.

FIG. 8 shows a cross section of the substrate after a layer of TEOS oxide has been deposited over the surface of the layer 14 (FIG. 7) of nitride thereby including the trench 16/20 (FIG. 6) that has been formed for the STI region. The trench 16/20 is in this manner filled with TEOS. After the deposition of the layer of TEOS, the TEOS is removed from above the surface of the silicon substrate. At the same time, the layer 14 (FIG. 7) of nitride is removed. The method employed for the removal of the layer 22 of TEOS overlying the surface of the substrate (not shown) and the layer of nitride 14 (FIG. 7) overlying the surface of the substrate is the Chemical Mechanical Polishing (CMP) process. This removal continues down to the surface of the layer 12 of pad oxide.

It must be noted in FIG. 8 that the sidewalls of the trench that has been created for the STI region do not have a linear profile but have a profile that results in a larger opening at the top of the trench and a smaller opening at the bottom of the trench. This profile allows for a deeper trench while the slope of the upper portion of the trench allows for ion implant into the sidewalls of the trench. This ion implant is, as previously indicated, required in order to improve the STI punchthrough characteristics. For this implant to be effective, a degree of sloping of the sidewalls of the trench is required since, without this sloping, the ions would not effectively penetrate the sidewalls of the trench.

Figure 9:
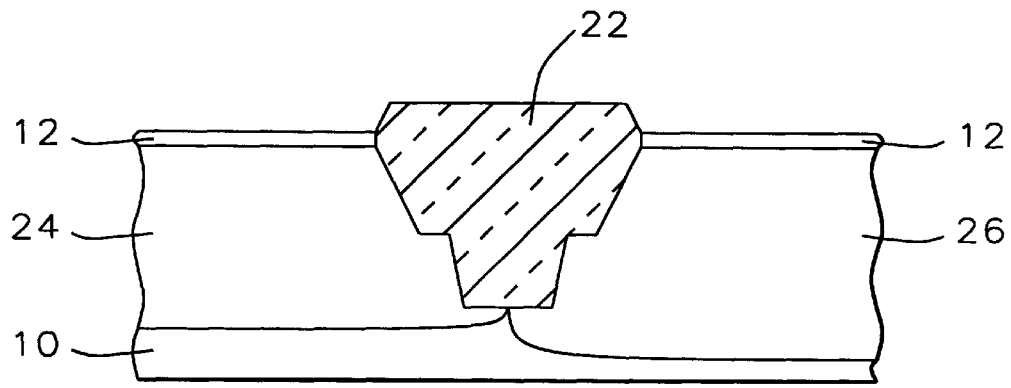
FIG. 9 shows a cross section of a substrate after the P-well and N-well implants have been performed.

FIG. 9 shows a cross section of the substrate after the P-well 24 and N-well 26 implant have been performed. Typical P-well and N-well implant conditions are as follows:

| P-well implant: | boron | - energy: | 100 to 220 keV |
| | | - dose: | 1e13 to 1e14 atoms/cm$^2$ |
| | boron | - energy: | 5 to 40 keV |
| | | - dose: | 1e12 to 5e13 atoms/cm$^2$ |
| | indium | - energy: | 50 to 250 keV |
| | | - dose: | 1e12 to 1e14 atoms/cm$^2$ |
| N-well implant: | P | - energy: | 300 to 600 keV |
| | | - dose: | 1e13 to 5e14 atoms/cm$^2$ |
| | P | - energy: | 50 to 300 keV |
| | | - dose: | 1e12 to 5e13 atoms/cm$^2$ |
| | As | - energy: | 50 to 200 keV |
| | | - dose: | 1e12 to 1e14 atoms/cm$^2$. |

FIG. 9 shows a cross section of the substrate after the N+ implant 28 and P+ implant 30 have been performed in the periphery of the STI regions. The implants are required to improve the punchthrough of the STI regions.

To form the region 28, the p-well region 24 is subjected to an n-type implant, for instance arsenic at a dose of between about 2.0E15 and 1.0E16 ions/cm$^3$ and an energy of between about 20 and 70 KeV. To form the region 30, the N-well region is subjected to an p-type implant, for instance boron at a dose of between about 1.0E15 and 1.0E16 ions/cm$^3$ and an energy of between about 50 and 90 KeV.

Figure 10:
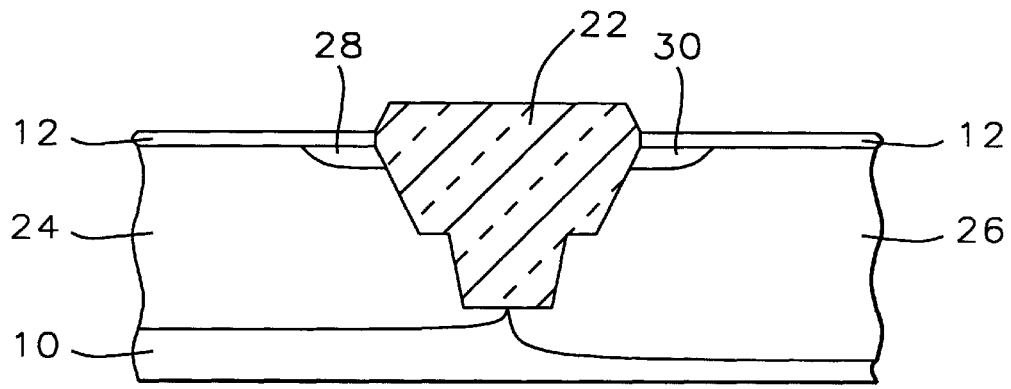
FIG. 10 shows a cross section of a substrate after an $N^+$ implant and an $P^+$ implant have been performed around the periphery of the STI trench.

It must be noted from FIG. 10 that the region of interfaces between the N+ implant 28 and the underlying P-well 24 and the interface between the P+ implant 30 and the underlying N-well 26 are relatively large. This results in better electrical isolation between the STI trench around the periphery of the trench, which in turn results in improved breakdown characteristics of the STI region.

It is clear from the above that the invention teaches a process that results in:

a trench for the STI region that has a two layered profile whereby the angles of the sides of each of the two layers are different the upper level of the trench for the STI region has relatively less steep sidewalls the lower level of the trench for the STI region has a relatively steep sidewalls the combined upper level and lower level of the trench for the STI region form a deep trench impurity implants into the sidewalls of the upper level of the trench for the STI region can effectively be performed ion implants around the periphery of the trench for the STI regions leads to a relatively large interface between the N+ diffused region and the underlying P-well and the P+ diffused region and the underlying N-well thereby improving breakdown characteristics of the STI region.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of forming a narrow deep trench isolation on a semiconductor substrate, comprising the steps of:

providing a semiconductor substrate;

forming a pad layer over the surface of said substrate;

forming a barrier layer over the surface of said pad layer;

patterning said barrier layer and said pad layer forming an opening;

etching said substrate through said opening forming a first trench in said substrate said first trench having sidewalls and a bottom, said first trench having sloping sidewalls whereby a surface area of a cross section of said first trench in a plane that is parallel with the surface of said substrate decreases in size the further said cross section is removed from the surface of said substrate;

growing a layer of first oxide over the surface of said patterned barrier layer and said patterned pad layer thereby including inside surfaces of said first trench;

forming buffer oxide spacers over said sidewalls of said first trench;

etching said substrate on said bottom of said first trench forming a second trench, said second trench having sloping sidewalls whereby a surface area of a cross section of said second trench in a plane that is parallel with the surface of said substrate decreases in size the further said cross section is removed from the surface of said substrate;

removing said buffer oxide spacers from said sidewalls of said first trench;

depositing a second layer of oxide over the surface of said patterned barrier layer thereby including said first trench and said second trench;

polishing using CMP said second layer of oxide thereby removing said second layer of oxide from above the surface of said patterned barrier layer thereby furthermore removing said patterned barrier layer from above said pad layer;

performing N-well and P-well implants in the surface of said substrate said N-well and P-well implants to be aligned with and adjacent to and on opposite sides of said first and second trench; and performing N+ and P+ implants around the periphery of said first trench.

2. The method of claim 1 wherein said forming a pad layer is forming a layer of pad oxide using Low Pressure CVD to a thickness of between 20 and 500 Angstrom.

3. The method of claim 1 wherein said forming a barrier layer over the surface of said pad layer is depositing a layer containing silicon nitride using LPCVD or PECVD procedures, at a temperature between about 200 and 800 degrees C., to a thickness between about 200 and 5000 Angstrom employing SiN or $SiO_xN_y$ as a silicon source material and ammonia as a nitrogen source material.

4. The method of claim 1 wherein said patterning said barrier layer and said pad layer forming an opening is performing an anisotropical etched with a plasma gas containing carbon tetrafloride ($CF_4$) containing fluorine ions, in a commercial etcher such as a parallel plate RIE apparatus or an electron cyclotron resonance (ECR) plasma reactor.

5. The method of claim 1 wherein said patterning said barrier layer and said pad layer forming an opening is using $He/NF_3$ as an etchant at a temperature of between about 80 and 100 degrees C. and a pressure of about 1.20 and 1.30 Torr for a time of between about 20 and 30 seconds using a dry etch process.

6. The method of claim 1 wherein said etching said substrate through said opening forming a first trench is using a dry etch wherein the wafer is exposed to a plasma containing one or more of the elements selected for the group comprising halogenated compounds such as $CF_4$, $CHF_3$, $SF_6$ or $NF_3$ or gases such as $O_2$, Ar or $N_2$.

7. The method of claim 1 wherein said growing a layer of first oxide over the surface of said patterned barrier layer is depositing a layer of TEOS using PECVD at a temperature between about 300 and 700 degrees C. to a thickness between about 1000 and 3000 Angstrom.

8. The method of claim 1 wherein said forming buffer oxide spacers over said sidewalls of said first trench is etching said layer of TEOS using reactive ion, plasma or sputter etch technologies or anisotropic RIE thereby applying as etchant either hot phosphoric acid or $CHF_3$ or $CF_4$—$O_2$—He thereby removing said TEOS from the surface of said barrier layer thereby furthermore leaving said TEOS in place along the sidewalls of said first trench.

9. The method of claim 1 wherein said etching said substrate on said bottom of said first trench is using a dry etch wherein the wafer is exposed to a plasma containing one or more of the elements selected for the group comprising halogenated compounds such as $CF_4$, $CHF_3$, $SF_6$ or $NF_3$ or gases such as $O_2$, Ar or $N_2$.

10. The method of claim 1 wherein said removing said buffer oxide spacers from said sidewalls of said first trench is removing said TEOS from the sidewalls of said first trench using reactive ion, plasma or sputter etch technologies or anisotropic RIE thereby applying as etchant either hot phosphoric acid or $CHF_3$ or $CF_4$—$O_2$—He.

11. The method of claim 10 wherein said removing of said buffer oxide spacers is monitored by end-point detection using a plasma emission spectra whereby said plasma emission spectrum indicates that virtually all of the buffer oxide spacers has been removed from said sidewalls of said first trench.

12. The method of claim 1 wherein said depositing a second layer of oxide over the surface of said patterned barrier layer is depositing a layer of TEOS using PECVD at a temperature between about 300 and 700 degrees C. to a thickness between about 1000 and 3000 Angstrom.

13. The method of claim 1 wherein said Performing N+ implants is implanting arsenic or phosphorous at a dose of between about 2.0E15 and 1.0E16 ions/$cm^3$ and an energy of between about 20 and 70 KeV.

14. The method of claim 1 wherein said Performing P+ implants is implanting boron or indium at a dose of between about 1.0E15 and 1.0E16 ions/$cm^3$ and an energy of between about 50 and 90 KeV.

15. The method of claim 1 wherein the opening at the top of said first trench has a width of between about 0.25 and 0.5 um.

16. The method of claim 1 wherein the bottom of said first trench has a width of between about 0.10 and 0.20 um.

17. The method of claim 1 wherein said first trench has a depth from the surface of said substrate of between about 1.0 and 3.0 um.

18. The method of claim 1 wherein the opening at the top of said second trench has a width of between about 0.08 and 0.15 um.

19. The method of claim 1 wherein the bottom of said second trench has a width of between about 0.05 and 0.10 um.

20. The method of claim 1 wherein said second trench has a depth from the surface of said substrate of between about 4.0 and 10.0 um.

21. A method of forming a narrow deep trench isolation on a semiconductor substrate, comprising the steps of:

providing a semiconductor substrate;

forming a layer of pad oxide over the surface of said substrate to a thickness of between 20 and 500 Angstrom; forming a silicon nitride layer over the surface of said layer of pad oxide to a thickness between about 200 and 5000 Angstrom; patterning said silicon nitride layer and said pad oxide layer forming an opening said opening to overlay and align with the region on the surface of said substrate where said narrow deep trench isolation is to be formed;

etching said substrate through said opening forming a first trench in said substrate said first trench having sidewalls and a bottom said first trench having a depth from the surface of said substrate of between about 1.0 and 3.0 um;

depositing a first layer of TEOS to a thickness between about 1000 and 3000 Angstrom over the surface of said patterned silicon nitride layer thereby including the inside surfaces of said first trench;

forming TEOS spacers over said sidewalls of said first trench to a thickness of between about 300 and 600 Angstrom said TEOS spacers to be formed by etching said deposited layer of TEOS;

etching said substrate on said bottom of said first trench forming a second trench said second trench having a depth from the surface of said substrate of between about 4.0 and 10.0 um;

removing said TEOS spacers from said sidewalls of said first trench;

depositing a second layer of TEOS oxide over the surface of said patterned silicon nitride layer to a thickness between about 1000 and 3000 Angstrom thereby including said first trench and said second trench;

polishing said second layer of TEOS oxide using CMP thereby removing said second layer of TEOS oxide from above the surface of said patterned silicon nitride layer thereby furthermore removing said patterned silicon nitride layer from above said pad oxide layer;

performing N-well and P-well implants in the surface of said substrate said N-well and P-well implants to be aligned with and adjacent to and on opposite sides of said first and second trench; and performing N+ and P+ implants around the periphery of said first trench wherein said performing N+ implants is implanting arsenic or phosphorous at a dose of between about 2.0E15 and 1.0E16 ions/$cm^3$ and an energy of between about 20 and 70 KeV wherein furthermore said performing P+ implants is implanting boron or indium at a dose of between about 1.0E15 and 1.0E16 ions/$cm^3$ and an energy of between about 50 and 90 KeV.

* * * * *